(12) United States Patent
Garbossa et al.

(10) Patent No.: US 10,734,798 B2
(45) Date of Patent: Aug. 4, 2020

(54) REDUNDANT MONITORING FOR VOLTAGE REGULATOR

(71) Applicant: Infineon Technologies AG, Neubiberg (DE)

(72) Inventors: Cristian Garbossa, Bressanone (IT); Bernhard Wotruba, Munich (DE)

(73) Assignee: Infineon Technologies AG, Neubiberg (DE)

( * ) Notice: Subject to any disclaimer, the term of this patent is extended or adjusted under 35 U.S.C. 154(b) by 123 days.

(21) Appl. No.: 15/984,212

(22) Filed: May 18, 2018

(65) Prior Publication Data

US 2019/0356126 A1 Nov. 21, 2019

(51) Int. Cl.
| | | |
|---|---|---|
| G01R 19/165 | (2006.01) | |
| H02H 1/00 | (2006.01) | |
| G05F 3/08 | (2006.01) | |
| H02H 3/20 | (2006.01) | |

(52) U.S. Cl.
CPC ..... *H02H 1/0007* (2013.01); *G01R 19/16538* (2013.01); *G05F 3/08* (2013.01); *H02H 3/202* (2013.01)

(58) Field of Classification Search
CPC ......... H02H 1/0007; H02H 3/202; G05F 3/08
See application file for complete search history.

(56) References Cited

U.S. PATENT DOCUMENTS

| | | | | |
|---|---|---|---|---|
| 2009/0295467 A1* | 12/2009 | Berzins | .............. | H03K 19/0016 327/544 |
| 2010/0164457 A1* | 7/2010 | Al-Shyoukh | ......... | H03F 3/2173 323/284 |
| 2012/0062311 A1* | 3/2012 | Chen | .............. | H03K 19/018521 327/535 |
| 2014/0068311 A1* | 3/2014 | Jenne | ........................ | G06F 1/28 713/340 |
| 2018/0166984 A1* | 6/2018 | McIntosh | ................ | H02M 1/08 |
| 2019/0170832 A1* | 6/2019 | Kravljaca | .............. | G01R 33/07 |

FOREIGN PATENT DOCUMENTS

| | | |
|---|---|---|
| CN | 101470453 A | 7/2009 |
| CN | 107968456 A | 4/2018 |

OTHER PUBLICATIONS

Office Action, in the Chinese language, from counterpart Chinese Application No. 201910414049.4, dated Mar. 27, 2020, 9 pp.

* cited by examiner

*Primary Examiner* — Alvaro E Fortich
(74) *Attorney, Agent, or Firm* — Shumaker & Sieffert, P.A.

(57) ABSTRACT

A circuit includes a first regulation module, second regulation module, first monitoring module, and second monitoring module. The first regulation module is configured to generate, from a supply voltage, a first voltage. The second regulation module is configured to generate, from a first voltage, a second voltage that is less than the first voltage. The first monitoring module is configured to generate a first warning signal when the first voltage exceeds a first threshold and to generate the first warning signal when a first testing voltage exceeds the first threshold. The second monitoring module is configured to generate a second warning signal when the second voltage exceeds a second threshold and to generate the second warning signal when a second testing voltage exceeds the second threshold.

20 Claims, 10 Drawing Sheets

REDUNDANT MONITORING FOR VOLTAGE REGULATOR

TECHNICAL FIELD

This disclosure relates to a voltage regulator, such as a linear voltage regulator, that is configured to meet safety requirements.

BACKGROUND

Voltage regulators may regulate an output voltage. For example, a linear voltage regulator may output a voltage of 3.5 volts using a supplied voltage of 14 volts. In various applications, a linear regulator may be configured with a safety system that helps to minimize a risk of damage caused by a failure of the voltage regulator. For example, a safety system generates a failure indication when a voltage output by the linear regulator exceeds 10 volts. Using the failure indication, the voltage regulator is disabled to prevent damage to electrical systems and people using the electrical systems.

SUMMARY

In general, this disclosure is directed to techniques for redundant monitoring of a voltage regulator. For example, a first regulation module (e.g., linear regulator) reduces a first voltage and a first monitoring module ensures that the first regulation module is operating within safety parameters (e.g., the first voltage is less than a threshold). In this example, a second regulation module further reduces the first voltage to a second voltage that may be used to supply power to a load and a first monitoring module ensures that the first regulation module is operating within safety parameters (e.g., the first voltage is less than a threshold) and a second monitoring module ensures that the second regulation module is operating within safety parameters (e.g., the second voltage is less than a threshold). In this way, more than one monitoring device detects an unsafe condition (e.g., when the first voltage or second voltage is unsafe), thereby providing redundant protection.

Further, in some examples, the first monitoring module may receive a testing voltage that causes the first monitoring module to trigger a first warning signal and the second monitoring module may receive a testing voltage that causes the second monitoring module to trigger a second warning signal. In this way, an operation of the first and second monitoring modules may be verified.

In an example, a circuit includes a first regulation module configured to receive a supply voltage from a voltage source and generate, from the supply voltage, a first voltage at a first voltage rail that is less than the supply voltage, a second regulation module configured to receive the first voltage from the first voltage rail and to generate, from the first voltage, a second voltage at a second voltage rail that is less than the first voltage, a first monitoring module configured to generate a first warning signal when the first voltage at the first voltage rail exceeds a first threshold and to generate the first warning signal when a first testing voltage exceeds the first threshold, and a second monitoring module configured to generate a second warning signal when the second voltage at the second voltage rail exceeds a second threshold and to generate the second warning signal when a second testing voltage exceeds the second threshold. The second threshold is less than the first threshold.

In another example, a method includes receiving, by circuitry, a supply voltage from a voltage source, generating, by the circuitry, from the supply voltage, a first voltage at a first voltage rail that is less than the supply voltage, receiving, by the circuitry, the first voltage from the first voltage rail, generating, by the circuitry, from the first voltage, a second voltage at a second voltage rail that is less than the first voltage, and generating, by the circuitry, a first warning signal when the first voltage at the first voltage rail exceeds a first threshold or when a first testing voltage exceeds the first threshold, and generating, by the circuitry, a second warning signal when the second voltage at the second voltage rail exceeds a second threshold or when a second testing voltage exceeds the second threshold, wherein the second threshold is less than the first threshold.

In another example, a circuit includes a voltage source configured to output a supply voltage, a first regulation module configured to receive the supply voltage from the voltage source and generate, from the supply voltage, a first voltage at a first voltage rail that is less than the supply voltage, a second regulation module configured to receive the first voltage from the first voltage rail and to generate, from the first voltage, a second voltage at a second voltage rail that is less than the first voltage, a load coupled to the second voltage rail, a first monitoring module configured to generate a first warning signal when the first voltage at the first voltage rail exceeds a first threshold and to generate the first warning signal when a first testing voltage exceeds the first threshold, a second monitoring module configured to generate a second warning signal when the second voltage at the second voltage rail exceeds a second threshold and to generate the second warning signal when a second testing voltage exceeds the second threshold, wherein the second threshold is less than the first threshold, and a controller configured to receive an indication of the first warning signal and the second warning signal.

Details of these and other examples are set forth in the accompanying drawings and the description below. Other features, objects, and advantages will be apparent from the description and drawings, and from the claims.

DETAILED DESCRIPTION

Products having safety requirements, for example, Automotive Safety Integrity Level (ASIL) D products, may apply protection in circuits configured for different supply lines (e.g., a battery, 5V, 1V, etc.) to prevent an unsafe voltage from propagating to a lower voltage rail, which may severely compromise functions operating on the lower voltage rail. In order to address a robustness against multiple point failures, safety requirements may specify that protection mechanisms are be testable at least once per driving cycle (e.g., with a Built-in Self-Test (BIST)).

A redundant system that includes a pre-regulator and a safety-regulator is described herein. Each regulator may be monitored by a respective monitoring module. For example, a first monitoring module generates a first warning signal when a voltage at the pre-regulator exceeds a first threshold or during a first testing state. Similarly, a second monitoring module generates a second warning signal when a voltage at the safety-regulator exceeds a second threshold or during a second testing state. As such, an operation of the first monitoring module may be tested (e.g., every driving cycle) by receiving the first warning signal during the first testing state and an operation of the second monitoring module may be tested (e.g., every driving cycle) by receiving the second warning signal during the second testing state. In this way, the redundant system may prevent an unsafe voltage from propagating to a lower rail as well as provide protection mechanisms that are testable.

Figure 1:
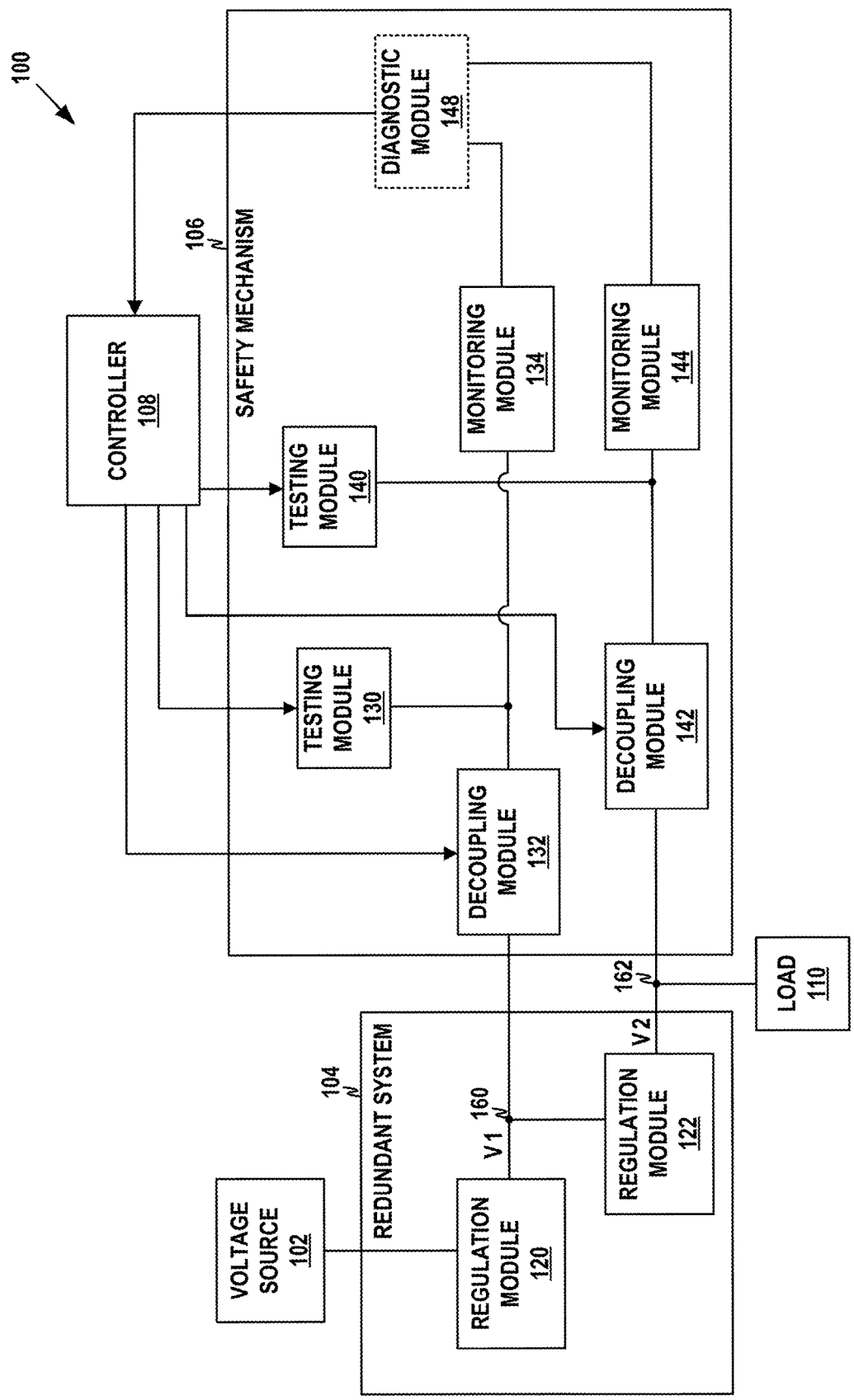
FIG. 1 is a block diagram illustrating an example system configured for redundant monitoring, in accordance with one or more techniques of this disclosure.

FIG. 1 is a block diagram illustrating an example system 100 configured for redundant monitoring, in accordance with one or more techniques of this disclosure. As illustrated in this example of FIG. 1, system 100 may include voltage source 102, redundant system 104, safety mechanism 106, controller 108, and load 110.

Voltage source 102 may be configured to provide electrical power to one or more other components of system 100. For instance, voltage source 102 may be configured to supply an input power to load 110. In some examples, voltage source 102 includes a battery which may be configured to store electrical energy. Examples of batteries may include, but are not limited to, nickel-cadmium, lead-acid, nickel-metal hydride, nickel-zinc, silver-oxide, lithium-ion, lithium polymer, any other type of rechargeable battery, or any combination of the same. In some examples, voltage source 102 may include an output of a power converter or power inverter. For instance, voltage source 102 may include an output of a direct current (DC) to DC power converter, an alternating current (AC) to DC power converter, and the like. In some examples, voltage source 102 may represent a connection to an electrical supply grid. In some examples, the input power signal provided by voltage source 102 may be a DC input power signal. For instance, in some examples, voltage source 102 may be configured to provide a DC input power signal in the range of ~5 VDC to ~40 VDC.

Load 110 may include devices configured to accept, via redundant system 104, power from voltage source 102. In some examples, load 110 may be a resistive load. Examples of resistive loads may include seat adjustment, auxiliary heating, window heating, light emitting diodes (LEDs), rear lighting, or other resistive loads. In some examples, load 110 may be an inductive load. Examples of inductive loads may include actuators, motors, and pumps used in one or more of a wiper system, anti-lock brake system (ABS), electronic braking system (EBS), relay, battery disconnect, fan, or other systems that include inductive loads. In some examples, load 110 may be a capacitive load. Examples of capacitive loads may include lighting elements, such as a Xenon arc lamp. In some examples, loads may be combinations of resistive, inductive, and capacitive loads.

Redundant system 104 may include regulation module 120 (also referred to herein as "first regulation module") and regulation module 122 also referred to herein as "second regulation module." Regulation module 120 may include a safety regulator. Regulation module 122 may include a pre-regulator.

Regulation module 120 may include any device suitable to control an amount of current flowing through regulation module 120. For example, regulation module 120 may include one or more pass elements that may each be switched to control a current flow through a respective pass element. Examples of pass elements may include, but are not limited to, silicon controlled rectifier (SCR), a Field Effect Transistor (FET), and bipolar junction transistor (BJT). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, depletion mode p-channel MOSFET (PMOS), enhancement mode PMOS, depletion mode n-channel MOSFET (NMOS), enhancement mode NMOS, double-diffused MOSFET (DMOS), or any other type of MOSFET, or any combination of the same. Examples of BJTs may include, but are not limited to, PNP, NPN, heterojunction, or any other type of BJT, or any combination of the same. It should be understood that pass elements may be a high side or low side. Additionally, pass elements may be voltage-controlled and/or current-controlled. Examples of current-controlled switching elements may include, but are not limited to, gallium nitride (GaN) MOSFETs, BJTs, or other current-controlled elements.

Similarly, regulation module 122 may include any device suitable to control an amount of current flowing through regulation module 122. For example, regulation module 122 may include one or more pass elements that may each be switched to control a current flow through a respective pass element.

Safety mechanism 106 may include testing module 130 (also referred to herein as "first testing module"), decoupling module 132 (also referred to herein as "first decoupling module"), monitoring module 134 (also referred to herein as "first monitoring module"), testing module 140 (also referred to herein as "second regulation module"), decoupling module 142 (also referred to herein as "second decoupling module"), and monitoring module 144 (also referred to herein as "second monitoring module"). In some examples, safety mechanism 106 may optionally include diagnostic module 148, which is illustrated in FIG. 1 as being option by dashed lines. For instance, outputs of monitoring module 134 and monitoring module 144 may be directly coupled to controller 108.

Testing module 130 may be configured to generate a first testing voltage. For example, testing module 130 may include a current source configured to generate a current that generates the first testing voltage. In some examples, testing module 130 may include a voltage source that generates the first testing voltage.

Similarly, testing module 140 may be configured to generate a second testing voltage. For example, testing module 140 may include a current source configured to generate a current that generates the second testing voltage. In some examples, testing module 140 may include a voltage source that generates the second testing voltage.

Decoupling module 132 may be configured to prevent the first test voltage output by testing module 130 from providing power to voltage rail 160 (also referred to herein as "first voltage rail") when the first testing voltage is greater than a voltage at voltage rail 160. For example, decoupling module 132 may include a diode. In some examples, decoupling module 132 may include a resistive element that causes a switching element to prevent the first test voltage output by testing module 130 from providing power to voltage rail 160. In some examples, decoupling module 132 may include a switching element. Examples of a switching element may include, but are not limited to, silicon controlled rectifier (SCR), a Field Effect Transistor (FET), and bipolar junction transistor (BJT). Examples of FETs may include, but are not limited to, junction field-effect transistor (JFET), metal-oxide-semiconductor FET (MOSFET), dual-gate MOSFET, insulated-gate bipolar transistor (IGBT), any other type of FET, or any combination of the same. Examples of MOSFETS may include, but are not limited to, PMOS, NMOS, DMOS, or any other type of MOSFET, or any combination of the same. Examples of BJTs may include, but are not limited to, PNP, NPN, heterojunction, or any other type of BJT, or any combination of the same. It should be understood that a switching element may be a high side switch or low side switch. Additionally, a switching element may be voltage-controlled and/or current-controlled. Examples of current-controlled switching elements may include, but are not limited to, gallium nitride (GaN) MOSFETs, BJTs, or other current-controlled elements.

Similarly, decoupling module 142 may be configured to prevent the second test voltage output by testing module 140 from providing power to voltage rail 162 (also referred to herein as "second voltage rail") when the second testing voltage is greater than a voltage at voltage rail 162. For example, decoupling module 142 may include a diode. In some examples, decoupling module 142 may include a resistive element that causes a switching element to prevent the first test voltage output by testing module 140 from providing power to voltage rail 162. In some examples, decoupling module 142 may include a switching element.

Monitoring module 134 may be configured to generate a first warning signal when the first voltage at the first voltage rail exceeds a first threshold. The first threshold may, for example, be specified by a voltage at a threshold voltage source, specified by pull-up resistor, pre-configured in an analog-to-digital converter, specified by a breakdown voltage of a Zener diode, specified by a resistor arranged in series with a switching element, or specified by another technique. For example, monitoring module 134 may include a comparator that generates the first warning signal when a difference between a voltage at voltage rail 160 and a voltage output by voltage source 102 is less than a threshold (e.g., 50 mV). In some examples, the monitoring module 134 may include a Zener diode that generates the first warning signal at an anode when a voltage at voltage rail 160 exceeds a breakdown voltage of the Zener diode.

Monitoring module 134 may be configured to generate the first warning signal when a first testing voltage exceeds the first threshold. For example, monitoring module 134 may include a comparator that generates the first warning signal when a difference between a voltage at voltage rail 160 and a first testing voltage output by testing module 130 is less than a threshold (e.g., 50 mV). In some examples, the monitoring module 134 may include a Zener diode that generates the first warning signal at an anode when a first testing voltage output by testing module 130 exceeds a breakdown voltage of the Zener diode.

Monitoring module 144 may be configured to generate a second warning signal when the first voltage at the first voltage rail exceeds a second threshold. The second threshold may, for example, be specified by a voltage at a threshold voltage source, specified by pull-up resistor, pre-configured in an analog-to-digital converter, specified by a breakdown voltage of a Zener diode, specified by a resistor arranged in series with a switching element, or specified by another technique. For example, monitoring module 144 may include a comparator that generates the second warning signal when a difference between a voltage at voltage rail 162 and a voltage output by regulation module 122 is less than a threshold (e.g., 50 mV). In some examples, the monitoring module 144 may include a switching element configured to provide the second warning signal at a drain of the switching element when a voltage output by regulation module 122 activates the switching element.

Monitoring module 144 may be configured to generate the second warning signal when a second testing voltage exceeds the second threshold. For example, monitoring module 144 may include a comparator that generates the second warning signal when a difference between a voltage at voltage rail 162 and a second testing voltage output by testing module 140 is less than a threshold (e.g., 50 mV). In some examples, the monitoring module 144 may include a switching element configured to provide the second warning signal at a drain of the switching element when a voltage output by testing module 140 activates the switching element.

Diagnostic module 148 may be configured to output a combined warning signal. For example, diagnostic module 148 may be configured to receive the first warning signal from monitoring module 134 and be configured to receive the second warning signal from monitoring module 144. In this example, diagnostic module 148 may output a combined warning signal in response to receiving the first warning signal or the second warning signal. In some examples, diagnostic module 148 may include switching elements arranged to form a current mirror such that an output of the current mirror generates the combined warning signal in response to receiving the first warning signal at a drain of a switching element of the current mirror or in response to receiving the second warning signal at gates of switching elements of the current mirror.

Controller 108 may be configured to control testing module 130, decoupling module 132, testing module 140 and decoupling module 142 to test protection mechanisms of system 100. For example, controller 108 may operate safety mechanism 106 in a first testing state to verify an operation of monitoring module 134. In the first testing state, testing module 130 may generate a first testing voltage to cause monitoring module 134 to generate a first warning signal and decoupling module 132 to prevent the first testing voltage from providing power to voltage rail 160. Similarly, controller 108 may operate safety mechanism 106 in a second testing state to verify an operation of monitoring module 144. In the second testing state, testing module 140 may generate a second testing voltage to cause monitoring module 144 to generate a second warning signal and decoupling module 142 to prevent the second testing voltage from providing power to voltage rail 162. In some examples, controller 108 may include an analog circuit. In some examples, controller 108 may be a microcontroller on a single integrated circuit containing a processor core, memory, inputs, and outputs. For example, controller 108 may include one or more processors, including one or more microprocessors, digital signal processors (DSPs), application specific integrated circuits (ASICs), field programmable gate arrays (FPGAs), or any other equivalent integrated or discrete logic circuitry, as well as any combinations of such components. The term "processor" or "processing circuitry" may generally refer to any of the foregoing logic circuitry, alone or in combination with other logic circuitry, or any other equivalent circuitry. In some examples, controller 108 may be a combination of one or more analog components and one or more digital components.

In accordance with one or more techniques described herein, regulation module 120 receives a supply voltage from voltage source 102. Regulation module 120 generates, from the supply voltage, a first voltage at voltage rail 160 that is less than the supply voltage. Regulation module 122 receives the first voltage from voltage rail 160. Regulation module 122 generates, from the first voltage, a second voltage at voltage rail 162 that is less than the first voltage. Monitoring module 134 generates a first warning signal when the first voltage at voltage rail 160 exceeds a first threshold or when a first testing voltage output by testing module 130 exceeds the first threshold. Monitoring module 144 generates a second warning signal when the second voltage at voltage rail 162 exceeds a second threshold or when a second testing voltage output by testing module 140 exceeds the second threshold. In this example, the second threshold is less than the first threshold.

Figure 2:
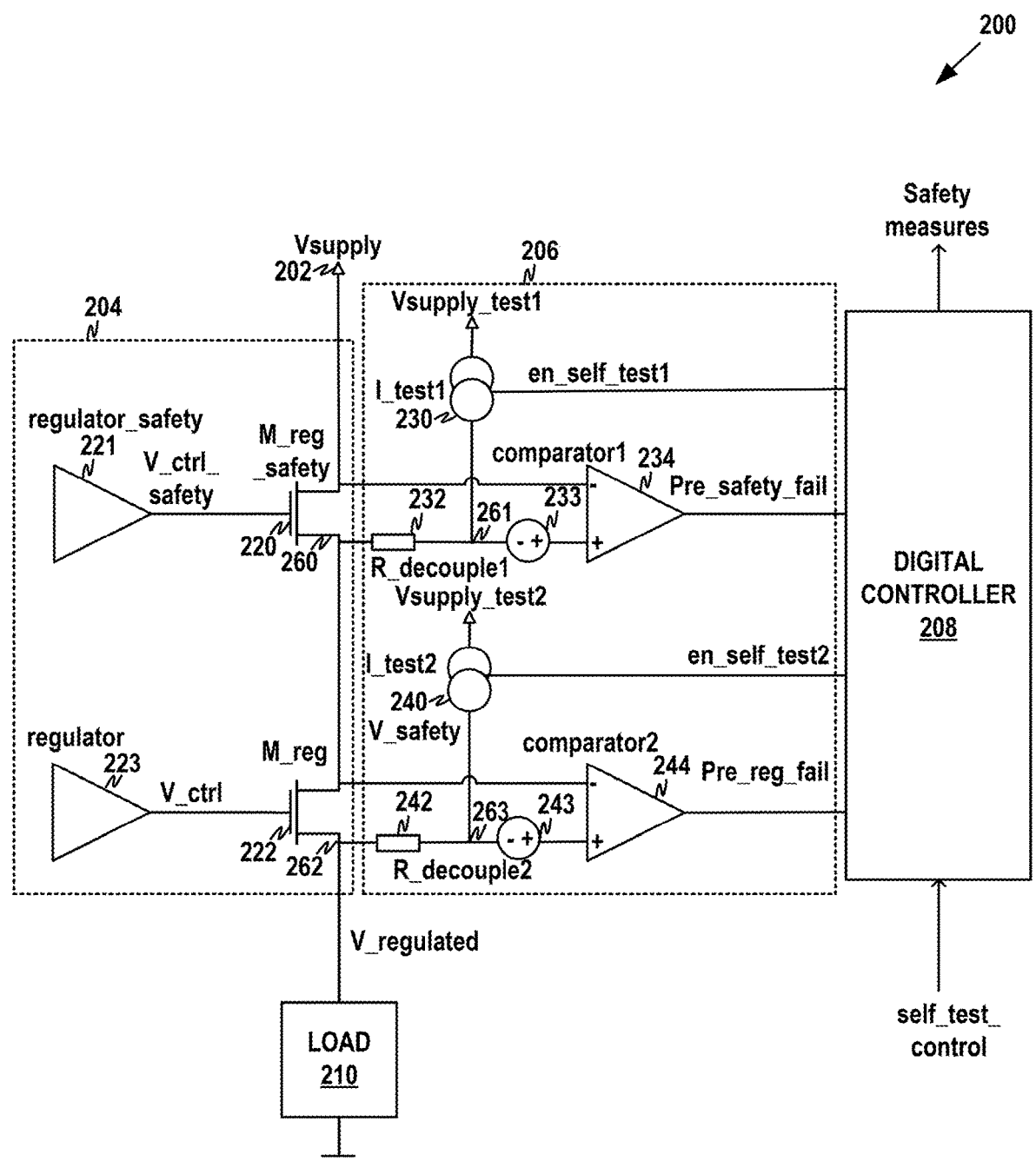
FIG. 2 is a circuit diagram illustrating a first example circuit configured for redundant monitoring, in accordance with one or more techniques of this disclosure.

FIG. 2 is a circuit diagram illustrating a first example circuit 200 configured for redundant monitoring, in accordance with one or more techniques of this disclosure. As illustrated, circuit 200 includes voltage source 202, redundant system 204, safety mechanism 206, controller 208, and load 210. Voltage source 202 may be an example of voltage source 102 of FIG. 1. Redundant system 204 may be an example of redundant system 104 of FIG. 1. Safety mechanism 206 may be an example of safety mechanism 106 of FIG. 1. Controller 208 may be an example of controller 108 of FIG. 1.

Redundant system 204 may include safety regulator driver 221, switching element 220 (also referred to herein as "safety regulator"), pre-regulator driver 223, and switching element 222 (also referred to herein as "pre-regulator"). Switching element 220 may be an example of regulation module 120 of FIG. 1. Switching element 222 may be an example of regulation module 122 of FIG. 1. Pre-regulator driver 223 may generate a signal to driver or operate switching element 222. Similarly, pre-regulator driver 223 may generate a signal to driver or operate switching element 222.

Safety mechanism 206 may include current source 230, decoupling module 232, threshold voltage source 233, comparator 234, current source 240, decoupling module 242, threshold voltage source 243, and comparator 244. Current source 230 may be an example of testing module 130 of FIG. 1. Decoupling module 232 may be an example of decoupling module 132 of FIG. 1. Threshold voltage source 233 and comparator 234 may be an example of monitoring module 134 of FIG. 1. Current source 240 may be an example of testing module 140 of FIG. 1. Decoupling module 242 may be an example of decoupling module 142 of FIG. 1. Threshold voltage source 243 and comparator 244 may be an example of monitoring module 144 of FIG. 1.

In the example of FIG. 2, a first node of switching element 220 is coupled to voltage supply 202 and a control node of switching element 220 is coupled to an output of safety regulator driver 221. A first node of switching element 222 is coupled to a second node of switching element 220, a control node of switching element 222 is coupled to an output of pre-regulator driver 223, and a second node of switching element 222 is coupled to load 210.

Comparator 234 includes a first node coupled to the first node of switching element 220. In this example, comparator 234 includes a second node, coupled, via first decoupling module 232 and threshold voltage source 233, to the second node of switching element 220 and coupled to an output of current source 230. Comparator 234 may generate the first warning signal at the output of comparator 234 when a voltage at the second node of comparator 234 exceeds a voltage at the first node of comparator 234.

Comparator 244 includes a first node coupled to the first node of switching element 222. In this example, comparator 244 includes a second node, coupled, via second decoupling module 242 and threshold voltage source 243, to the second node of switching element 222 and coupled to an output of current source 240. Comparator 244 may generate the second warning signal at the output of comparator 244 when a voltage at the second node of comparator 244 exceeds a voltage at the first node of comparator 244.

Controller 208 (also referred to herein as "digital controller") includes a first output configured for outputting a first command signal (illustrated as "en_self_test1") to cause current source 230 to operate in the first testing mode, a first input for receiving the first warning signal from comparator 234, a second output configured for outputting a second command signal (illustrated as "en_self_test2") to cause current source 240 to operate in the second testing mode, and a second input for receiving the second warning signal from comparator 244.

Controller 208 may be configured to include a third output for outputting, to decoupling module 232, a third command signal, to cause decoupling module 232 to decouple voltage rail 260 from the first testing voltage at voltage node 261 when the first testing voltage is greater than a voltage at voltage rail 260. In some examples, the third command signal may cause decoupling module 232 to couple voltage rail 260 to the first testing voltage at voltage node 261 when the first testing voltage is not greater than the voltage at voltage rail 260.

Controller 208 may be configured to include a fourth output for outputting, to decoupling module 242, a fourth command signal, to cause decoupling module 242 to decouple voltage rail 262 from the second testing voltage at voltage node 263 when the second testing voltage is greater than a voltage at voltage rail 262. In some examples, the fourth command signal may cause decoupling module 242 to couple voltage rail 262 to the second testing voltage at voltage node 263 when the second testing voltage is not greater than the voltage at voltage rail 262.

For example, in response to receiving an indication to test an operation of safety mechanism 206 (illustrated as "en_self_control"), controller 208 may output the first command signal to cause current source 230 to operate in the first testing mode and refrain from outputting the second command signal. In this example, current source 230 generates a current that generates a first testing voltage at voltage rail 261 exceeding a voltage threshold generated by threshold voltage source 233, which causes comparator 234 to generate a first warning signal. In response to receiving the first warning signal from comparator 234 when outputting the first command signal, controller 208 may determine that comparator 234 (e.g., a first monitoring module) is operating.

In response to receiving the indication to test the operation of safety mechanism 206, controller 208 may output the second command signal to cause current source 240 to operate in the second testing mode and refrain from outputting the first command signal. In this example, current source 240 generates a current that generates a second testing voltage at voltage rail 262 exceeding a voltage threshold generated by threshold voltage source 243, which causes comparator 244 to generate a second warning signal. In response to receiving the second warning signal from comparator 244 when outputting the second command signal, controller 208 may determine that comparator 244 (e.g., a second monitoring module) is operating.

In response to receiving a first warning signal when refraining from outputting the first command signal, controller 208 may output an indication that circuit 200 may be operating in an unsafe condition (illustrated as "Safety measures"). Similarly, in response to receiving a second warning signal when refraining from outputting the second command signal, controller 208 may output an indication that circuit 200 may be operating in an unsafe condition (illustrated as "Safety measures"). Controller 208 may output a combined warning signal (illustrated as "Safety measures") indicating that at least one of switching element 220 and switching element 222 are not outputting a target voltage. In this way, circuit 200 may implement safety measures, such as deactivating or restarting circuit 200 to avoid damage to circuit 200 and or people using circuit 200.

Figure 3:
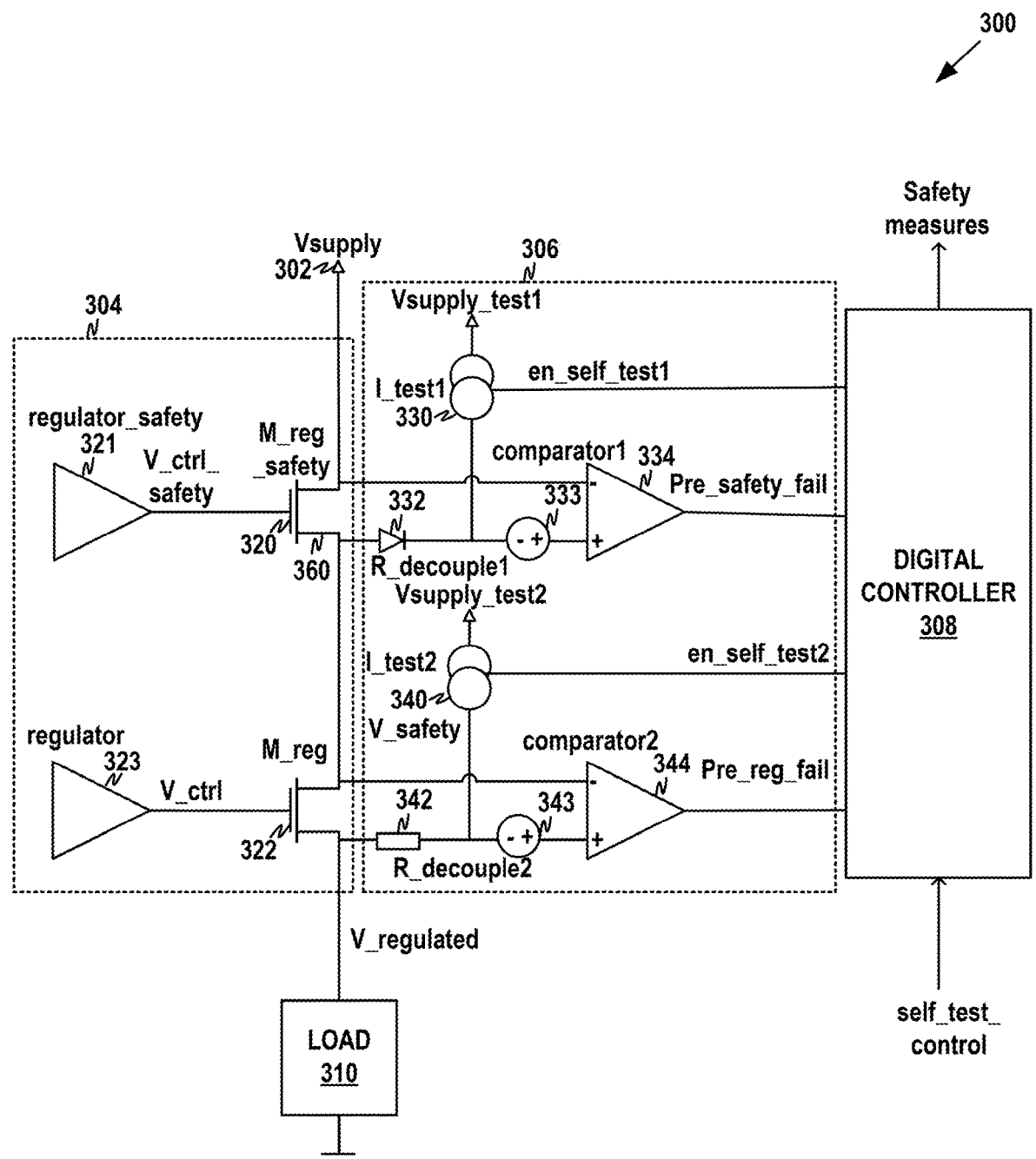
FIG. 3 is a circuit diagram illustrating a second example circuit configured for redundant monitoring, in accordance with one or more techniques of this disclosure.

FIG. 3 is a circuit diagram illustrating a second example circuit 300 configured for redundant monitoring, in accordance with one or more techniques of this disclosure. As illustrated, circuit 300 includes voltage source 302, redundant system 304, safety mechanism 306, controller 308, and load 310. Voltage source 302 may be an example of voltage source 102 of FIG. 1. Redundant system 304 may be an example of redundant system 104 of FIG. 1. Safety mechanism 306 may be an example of safety mechanism 106 of FIG. 1. Controller 308 may be an example of controller 108 of FIG. 1.

Circuit 300 is substantially similar to circuit 200 except that circuit 300 includes diode 332 instead of a decoupling module. For example, redundant system 304 may include safety regulator driver 321, switching element 320 (also referred to herein as "safety regulator"), pre-regulator driver 323, and switching element 322 (also referred to herein as "pre-regulator"). Safety mechanism 306 may include current source 330, threshold voltage source 333, comparator 334, current source 340, decoupling module 342, threshold voltage source 343, and comparator 344. As shown, diode 332 includes an anode coupled to voltage rail 360 and a cathode coupled to a second node of comparator 334 via threshold voltage source 333.

Figure 4:
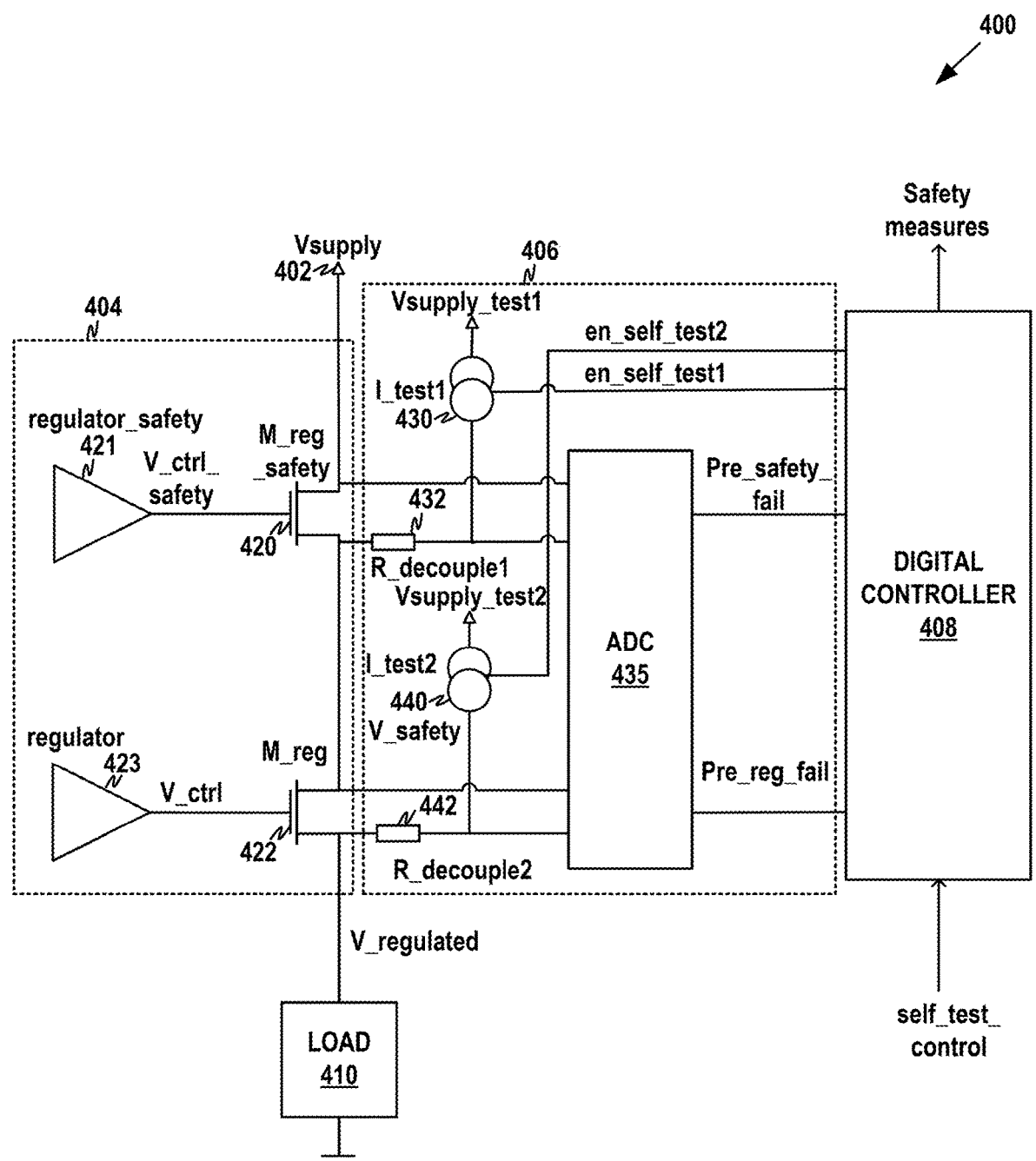
FIG. 4 is a circuit diagram illustrating a third example circuit configured for redundant monitoring, in accordance with one or more techniques of this disclosure.

FIG. 4 is a circuit diagram illustrating a third example circuit 400 configured for redundant monitoring, in accordance with one or more techniques of this disclosure. As illustrated, circuit 400 includes voltage source 402, redundant system 404, safety mechanism 406, controller 408, and load 410. Voltage source 402 may be an example of voltage source 102 of FIG. 1. Redundant system 404 may be an example of redundant system 104 of FIG. 1. Safety mechanism 406 may be an example of safety mechanism 106 of FIG. 1. Controller 408 may be an example of controller 108 of FIG. 1.

Redundant system 404 is substantially similar to redundant system 204. For example, redundant system 404 may include safety regulator driver 421, switching element 420 (also referred to herein as "safety regulator"), pre-regulator driver 423, and switching element 422 (also referred to herein as "pre-regulator").

Safety mechanism 406 may include current source 430, decoupling module 432, current source 440, and decoupling module 442. In the example of FIG. 4, analog-to-digital converter (ADC) 435 includes a first monitoring module and a second monitoring module. For example, ADC 435 may include a first input coupled to the first node of switching element 420. In this example, ADC 435 includes a second input, coupled, via first decoupling module 432, to the second node of switching element 420 and coupled to an output of current source 430. In this example, ADC 435 includes a third input coupled to the first node of pre-regulator 422. In this example, ADC 435 includes a fourth input, coupled, via second decoupling module 442, to the second node of pre-regulator 422 and coupled to an output of current source 440.

In the example of FIG. 4, controller 408 (also referred to herein as "digital controller") includes a first output configured for outputting a first command signal (illustrated as "en_self_test1") to cause current source 430 to operate in the first testing mode, a first input (illustrated as "Pre_safety_fail") for receiving the first warning signal from ADC 435, a second output configured for outputting a second command signal (illustrated as "en_self_test2") to cause current source 440 to operate in the second testing mode, and a second input (illustrated as "Pre_reg_fail") for receiving the second warning signal from ADC 435.

For example, in response to receiving an indication to test an operation of safety mechanism 406 (illustrated as "self_control"), controller 408 may output the first command signal to cause current source 430 to operate in the first testing mode and refrain from outputting the second command signal. In this example, current source 430 generates a current that generates a first testing voltage at the first input of ADC 435 exceeding a first voltage threshold specified by ADC 435, which causes ADC 435 to generate a first warning signal. In response to receiving the first warning signal from ADC 435 when outputting the first command signal, controller 408 may determine that a first portion of ADC 435 (e.g., a first monitoring module) is operating.

In response to receiving the indication to test the operation of safety mechanism 406, controller 408 may output the second command signal to cause current source 440 to operate in the second testing mode and refrain from outputting the first command signal. In this example, current source 440 generates a current that generates a second testing voltage at the first input of ADC 435 exceeding a second voltage threshold specified by ADC 435, which causes ADC 435 to generate a second warning signal. In response to receiving the second warning signal from ADC 435 when outputting the second command signal, controller 408 may determine that a second portion of ADC 435 (e.g., a second monitoring module) is operating.

In response to receiving a first warning signal when refraining from outputting the first command signal, controller 408 may output an indication that circuit 400 may be operating in an unsafe condition (illustrated as "Safety measures"). Similarly, in response to receiving a second warning signal when refraining from outputting the second command signal, controller 408 may output an indication that circuit 400 may be operating in an unsafe condition (illustrated as "Safety measures"). In some examples, controller 408 may output a combined warning signal (illustrated as "Safety measures") indicating that at least one of switching element 420 and switching element 422 are not outputting a target voltage. In this way, circuit 400 may implement safety measures, such as deactivating or restarting circuit 400 to avoid damage to circuit 400 and or people using circuit 400.

Figure 5A:
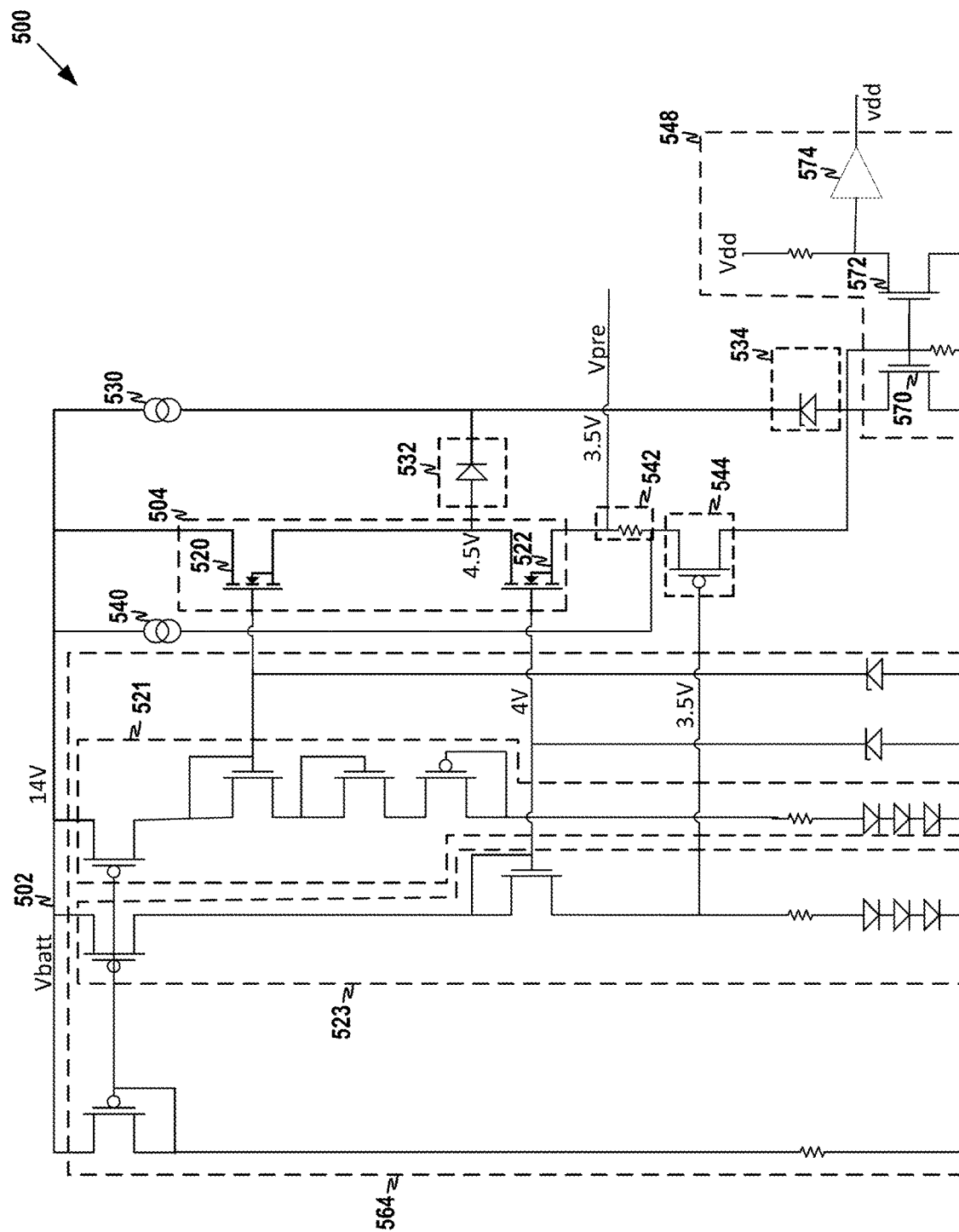
FIG. 5A is a circuit diagram illustrating a fourth example circuit configured for redundant monitoring during nominal operation, in accordance with one or more techniques of this disclosure.

FIG. 5A is a circuit diagram illustrating a fourth example circuit 500 configured for redundant monitoring during nominal operation, in accordance with one or more techniques of this disclosure. As illustrated, circuit 500 includes voltage source 502, redundant system 504, and driver 564. Voltage source 502 may be an example of voltage source 102 of FIG. 1. Redundant system 504 may be an example of redundant system 104 of FIG. 1. For example, redundant system 504 may include switching element 520 and switching element 522. Switching element 520 may be an example of regulation module 120 of FIG. 1. Switching element 522 may be an example of regulation module 122 of FIG. 1.

Moreover, circuit 500 includes current source 530, diode 532, Zener diode 534, current source 540, resistive element 542, switching element 544, and diagnostic module 548, which may form an example of safety mechanism 106 of FIG. 1. Current source 530 may be an example of testing module 130 of FIG. 1. Diode 532 may be an example of decoupling module 132 of FIG. 1. Zener diode 534 may be an example of monitoring module 134 of FIG. 1. Current source 540 may be an example of testing module 140 of FIG. 1. Switching element 544 may be an example of monitoring module 144 of FIG. 1. Resistive element 542, in operation with switching element 544, may be an example of decoupling module 142 of FIG. 1. Diagnostic module 548 may be an example of diagnostic module 148.

Driver 564 may include first driving module 521 configured to drive switching element 520 to generate the first voltage at the second node of switching element 520. Similarly, driver 564 may include second driving module 523 configured to drive switching element 522 to generate the second voltage at the second node of switching element 522.

In the example of FIG. 5A, a first node of switching element 520 is coupled to voltage source 502 and a control node of switching element 520 is coupled to an output of first driving module 521. A first node of switching element 522 is coupled to a second node of switching element 520, a control node of switching element 522 is coupled to an output of second driving module 523, and a second node of switching element 522 forms the output $V_{pre}$ for coupling to a load.

Diode 532 includes an anode coupled to the second node of switching element 520 and a cathode coupled to current source 530 and to a cathode of Zener diode 534. Switching element 544 includes a first node coupled to current source 540 and, via resistive element 542, to the second node of switching element 522. In this example, switching element 544 includes a second node coupled to diagnostic module 548.

Diagnostic module 548 includes switching element 570 and a switching element 572 arranged as a current mirror and includes a driver 574. Switching element 570 has a first node coupled to an anode of Zener diode 534 and a control node coupled to a second node of switching element 544. Switching element 572 includes a first node coupled to driver 574 and a control node coupled to a control node of switching element 570 and to the second node of switching element 544.

FIG. 5A illustrates circuit 500 during nominal operation. For example, voltage source 502 outputs a voltage of 14 Volts. Switching element 520 outputs a voltage of 4.5 volts from the 14 Volts output by voltage source 502. In this example, the voltage output by switching element 520 does not overcome a threshold voltage of Zener diode 534. Accordingly, Zener diode 534 does not generate a first warning signal. Switching element 522 outputs a voltage of 3.5 volts from the 4.5 Volts output by switching element 520. Accordingly, the voltage output by switching element 522 is not greater than a threshold voltage at the control node of switching element 544. As such, switching element 544 does not generate a second warning signal.

Figure 5B:
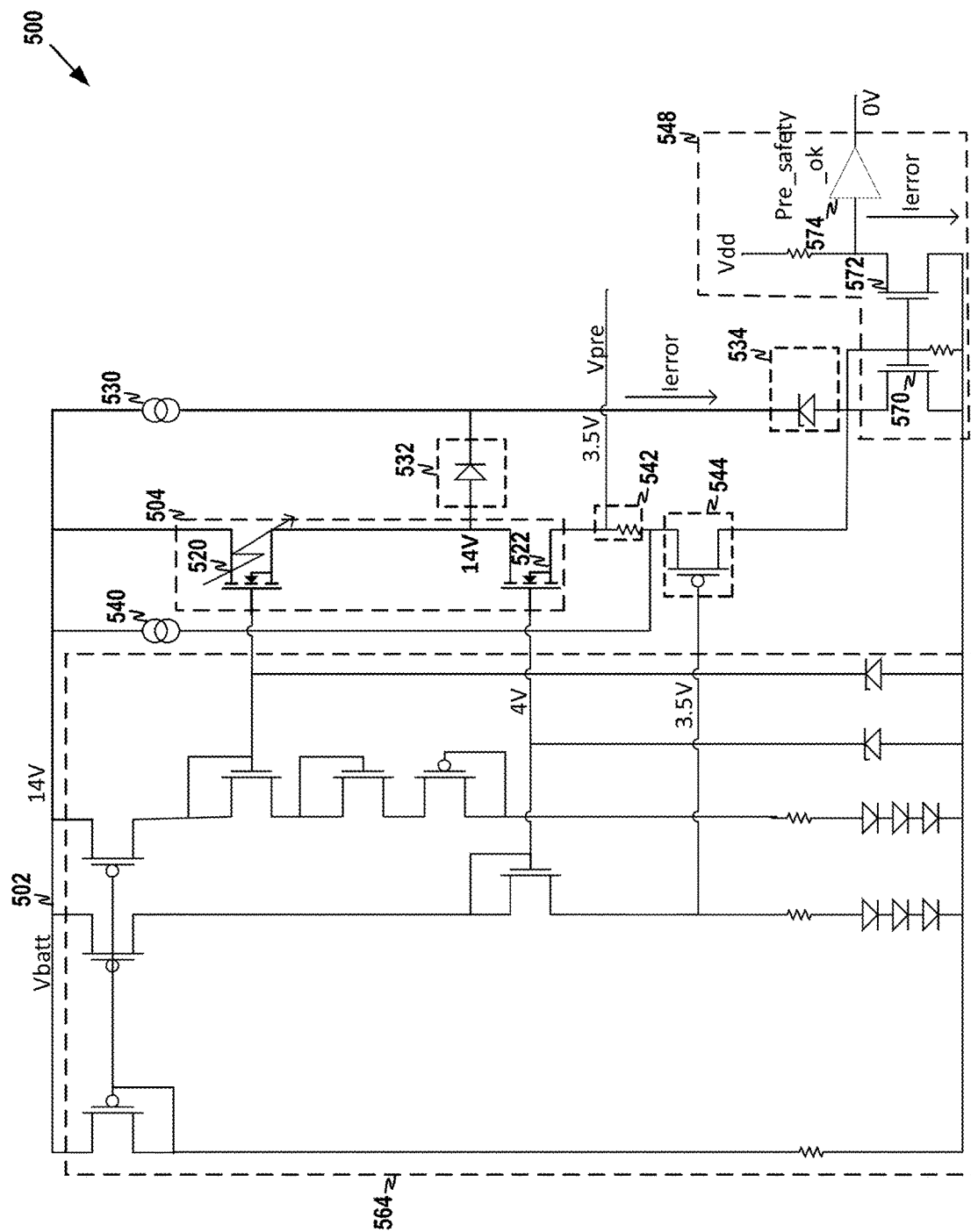
FIG. 5B is a circuit diagram illustrating the example circuit of FIG. 5A during a failure of a safety regulator operation, in accordance with one or more techniques of this disclosure.

FIG. 5B is a circuit diagram illustrating the example circuit 500 of FIG. 5A during a failure of a safety regulator operation, in accordance with one or more techniques of this disclosure. FIG. 5B illustrates circuit 500 during a failure of a safety regulator operation. For example, voltage source 502 outputs a voltage of 14 Volts. Switching element 520 outputs a voltage of 14 volts from the 14 Volts output by voltage source 502. That is, switching element 520 fails to reduce the voltage output by voltage source 502 to a target voltage level (e.g., 4.5 volts). In this example, the voltage output by switching element 520 overcomes a threshold voltage of Zener diode 534. As such, Zener diode 534 generates a first warning signal. Switching element 522 outputs a voltage of 3.5 volts from the 14 Volts output by switching element 520. Moreover, the voltage output by switching element 522 is not greater than a threshold voltage at the control node of switching element 544. As such, switching element 544 does not generate a second warning signal.

Figure 5C:
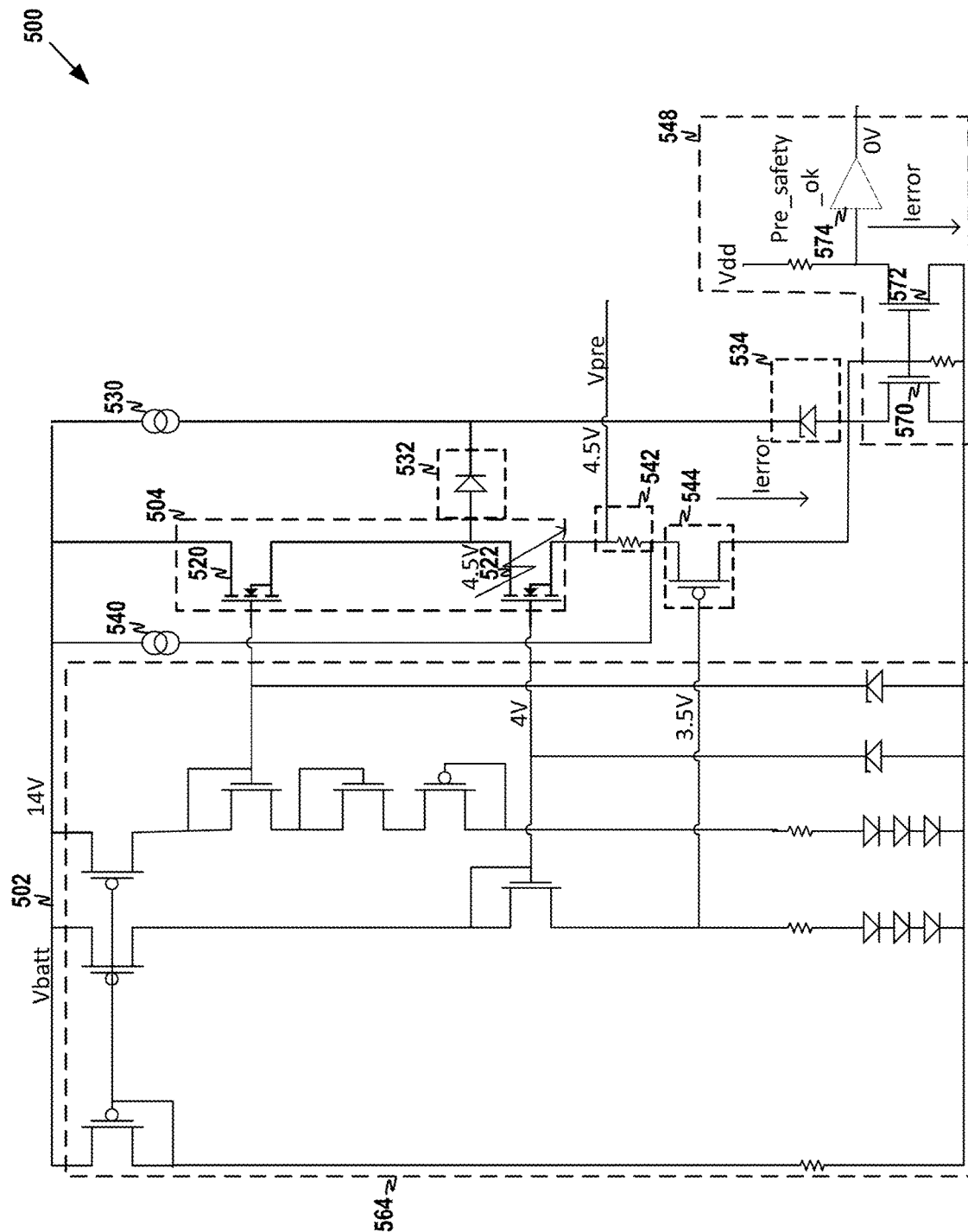
FIG. 5C is a circuit diagram illustrating the example circuit of FIG. 5A during a failure of a pre-regulator, in accordance with one or more techniques of this disclosure.

FIG. 5C is a circuit diagram illustrating the example circuit 500 of FIG. 5A during a failure of a pre-regulator, in accordance with one or more techniques of this disclosure. FIG. 5C illustrates circuit 500 during a failure of a safety regulator operation. For example, voltage source 502 outputs a voltage of 14 Volts. Switching element 520 outputs a voltage of 4.5 volts from the 14 Volts output by voltage source 502. In this example, the voltage output by switching element 520 does not overcome a threshold voltage of Zener diode 534. As such, Zener diode 534 does not generate a first warning signal. Switching element 522 outputs a voltage of 4.5 volts from the 4.5 Volts output by switching element 520. That is, switching element 522 fails to reduce the voltage output by switching element 520 to a target voltage level (e.g., 3.5 volts). Accordingly, the voltage output by switching element 522 is greater than a threshold voltage at the control node of switching element 544. As such, switching element 544 generates a second warning signal.

Figure 5D:
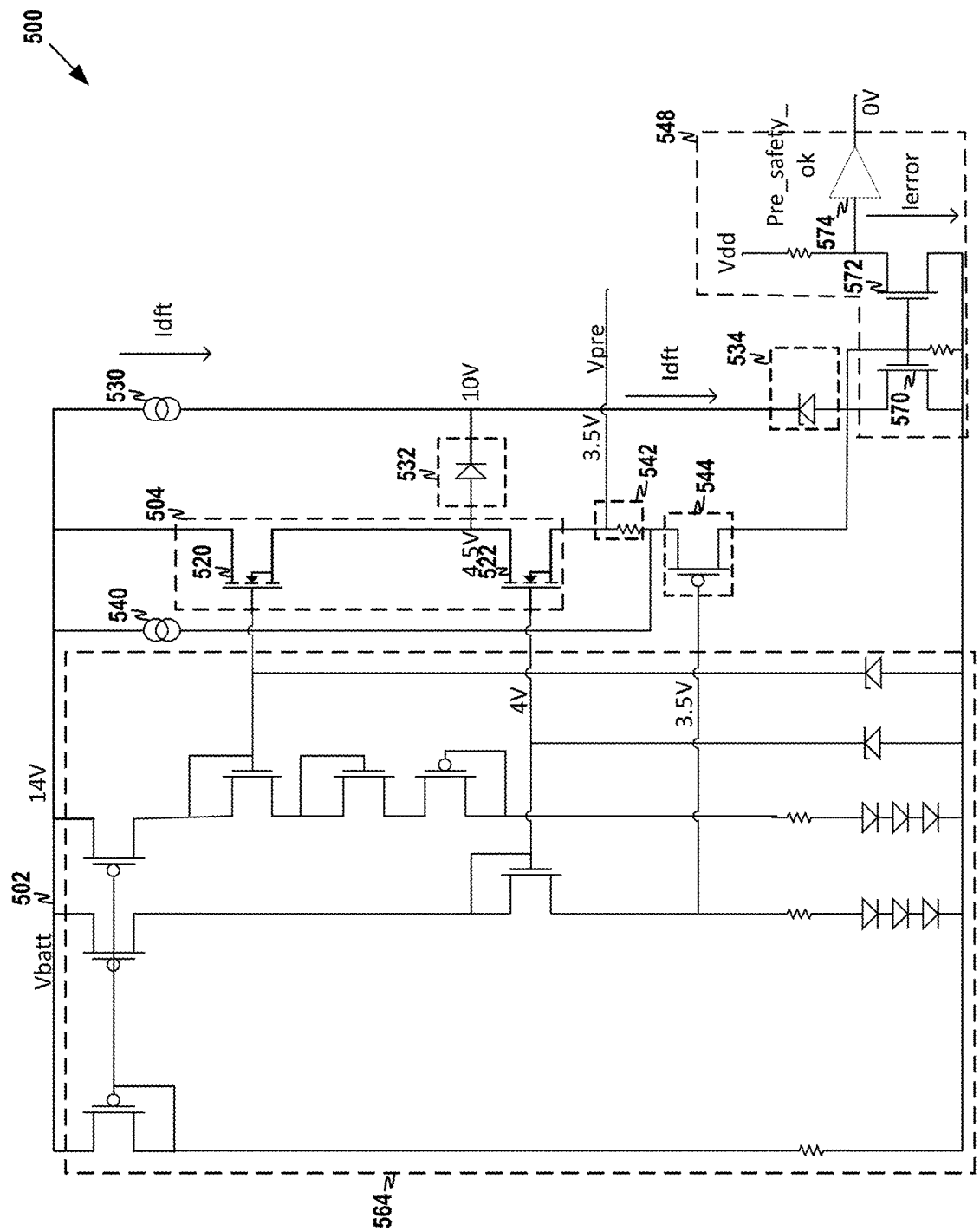
FIG. 5D is a circuit diagram illustrating the example circuit of FIG. 5A during a testing of a safety regulator, in accordance with one or more techniques of this disclosure.

FIG. 5D is a circuit diagram illustrating the example circuit of FIG. 5A during a testing of a safety regulator, in accordance with one or more techniques of this disclosure. FIG. 5D illustrates circuit 500 during a testing of a safety regulator. For example, current source 530 generates a current "Idft." The current from current source 530 generates a voltage at Zener diode 534 that overcomes a threshold voltage of Zener diode 534. As such, Zener diode 534 generates a first warning signal.

Figure 5E:
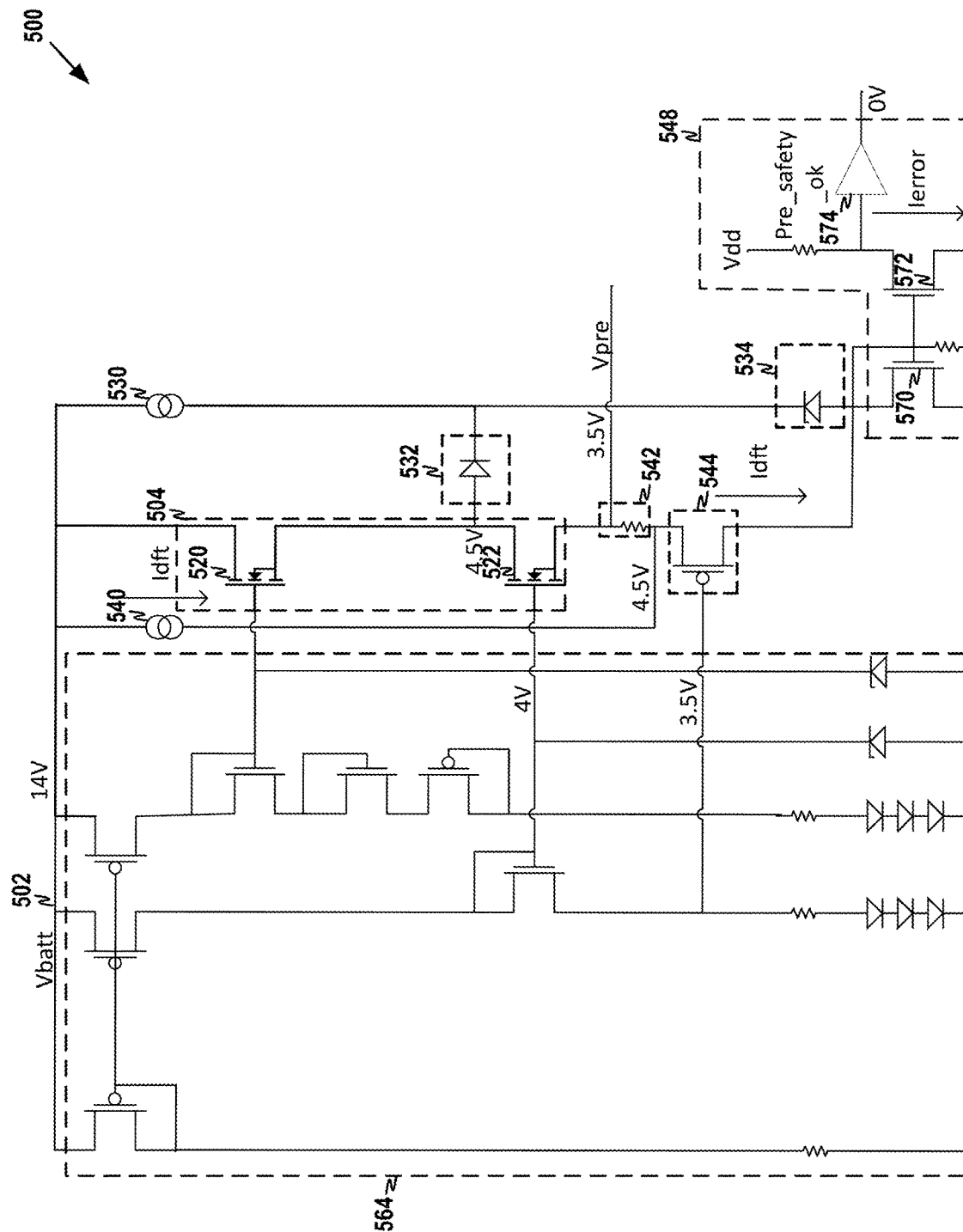
FIG. 5E is a circuit diagram illustrating the example circuit of FIG. 5A during a testing of a pre-regulator, in accordance with one or more techniques of this disclosure.

FIG. 5E is a circuit diagram illustrating the example circuit of FIG. 5A during a testing of a pre-regulator, in accordance with one or more techniques of this disclosure.

FIG. 5E illustrates circuit 500 during a testing of a pre-regulator. For example, current source 540 generates a current "Idft." The current from current source 540 generates a voltage at the first node of switching element 544 that is greater than a threshold voltage at the control node of switching element 544. As such, switching element 544 generates a second warning signal.

Figure 6:
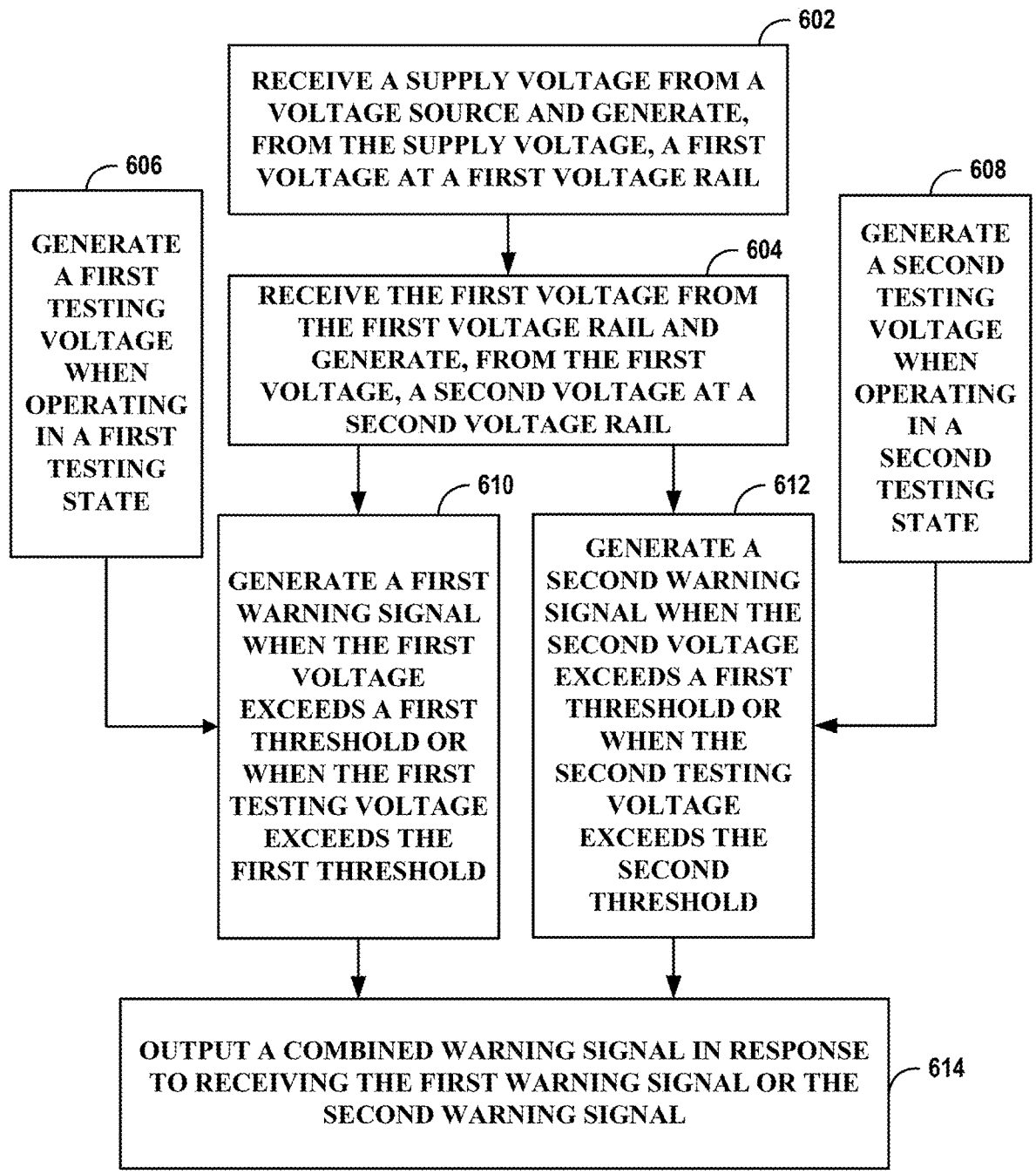
FIG. 6 is a flow diagram consistent with techniques that may be performed by the example system of FIG. 1, in accordance with this disclosure.

FIG. 6 is a flow diagram consistent with techniques that may be performed by the example system of FIG. 1, in accordance with this disclosure. For purposes of illustration only, FIG. 6 is described below within the context of system 100 of FIG. 1, circuit 200 of FIG. 2, circuit 300 of FIG. 3, circuit 400 of FIG. 4, and circuit 500 of FIGS. 5A-5E. However, the techniques described below can be used in any permutation, and in any combination, with voltage source 102, redundant system 104, safety mechanism 106, controller 108, and load 110.

In accordance with one or more techniques of this disclosure, a first regulation module receives a supply voltage from a voltage source and generates, from the supply voltage, a first voltage at a first voltage rail (602). For example, regulation module 120 receives a supply voltage from voltage source 102 and generates, from the supply voltage, a first voltage at voltage rail 160, In some examples, switching element 220 receives a supply voltage from voltage source 202 and generates, from the supply voltage, a first voltage at a first node of switching element 222. In some examples, switching element 520 receives a supply voltage from voltage source 502 and generates, from the supply voltage, a first voltage at a first node of switching element 522.

A second regulation module receives the first voltage from the first voltage rail and generates, from the first voltage, a second voltage at a second voltage rail (604). For example, regulation module 122 receives the first voltage from voltage rail 160 and generates, from the first voltage, a second voltage at voltage rail 162. In some examples, switching element 222 receives the first voltage from switching element 220 and generates, from the first voltage, a second voltage. In some examples, switching element 522 receives the first voltage from switching element 520 and generates, from the first voltage, a second voltage.

A first testing module generates a first testing voltage when operating in a first testing state (606). For example, testing module 130 generates a first testing voltage when operating in a first testing state. In some examples, current source 230 generates a first testing voltage when operating in a first testing state. In some examples, current source 530 generates a first testing voltage when operating in a first testing state.

A second testing module generates a second testing voltage when operating in a second testing state (608). For example, testing module 140 generates a second testing voltage when operating in a second testing state. In some examples, current source 240 generates a second testing voltage when operating in a second testing state. In some examples, current source 540 generates a second testing voltage when operating in a second testing state.

A first monitoring module generates a first warning signal when the first voltage exceeds a first threshold or when the first testing voltage exceeds the first threshold (610). For example, monitoring module 134 generates a first warning signal when the first voltage exceeds a first threshold or when the first testing voltage exceeds the first threshold. In some examples, comparator 234 generates a first warning signal when the first voltage exceeds a first threshold specified by threshold voltage source 233 or current source 230 generates a current that generates a first testing voltage at voltage rail 261 exceeding the first threshold specified by threshold voltage source 233. In some examples, Zener diode 534 generates a first warning signal when the first voltage exceeds a first threshold corresponding to a breakdown voltage of Zener diode 534 or when the first testing voltage exceeds the first threshold corresponding to the breakdown voltage of Zener diode 534.

A second monitoring module generates a second warning signal when the second voltage exceeds a first threshold or when the second testing voltage exceeds the second threshold (612). For example, monitoring module 144 generates a second warning signal when the second voltage exceeds a second threshold or when the second testing voltage exceeds the second threshold. In some examples, comparator 244 generates a second warning signal when the second voltage exceeds a second threshold or current source 240 generates a current that generates a second testing voltage at voltage rail 262 exceeding the second threshold specified by threshold voltage source 243. In some examples, switching element 544 generates a second warning signal when the second voltage exceeds a second threshold specified by a voltage at the control node of switching element 544 or when the second testing voltage exceeds the second threshold specified by the voltage at the control node of switching element 544.

A diagnostic module outputs a combined warning signal in response to receiving the first warning signal or the second warning signal (614). For example, diagnostic module 148 outputs a combined warning signal in response to receiving the first warning signal or the second warning signal. In some examples, diagnostic module 548 outputs a combined warning signal in response to receiving the first warning signal or the second warning signal.

While techniques have been described herein with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

It is to be recognized that depending on the example, certain acts or events of any of the techniques described herein can be performed in a different sequence, may be added, merged, or left out altogether (e.g., not all described acts or events are necessary for the practice of the techniques). Moreover, in certain examples, acts or events may be performed concurrently, e.g., through interrupt processing, or multiple processors, rather than sequentially.

Instructions may be executed by one or more processors, such as one or more digital signal processors (DSPs), general purpose microprocessors, application specific integrated circuits (ASICs), field programmable gate arrays (FPGAs), or other equivalent integrated or discrete logic circuitry. Accordingly, the term "processor," as used herein may refer to any of the foregoing structure or any other structure suitable for implementation of the techniques described herein. In addition, in some aspects, the functionality described herein may be provided within dedicated hardware and/or software modules configured for encoding and decoding, or incorporated in a combined codec. Also, the techniques could be fully implemented in one or more circuits or logic elements.

The techniques of this disclosure may be implemented in a wide variety of devices or apparatuses, including a wireless handset, an integrated circuit (IC) or a set of ICs (e.g., a chip set). Various components, modules, or units are described in this disclosure to emphasize functional aspects of devices configured to perform the disclosed techniques, but do not necessarily require realization by different hardware units. Rather, as described above, various units may be combined in a hardware unit or provided by a collection of interoperative hardware units, including one or more processors as described above, in conjunction with suitable software and/or firmware.

Various examples have been described. These and other examples are within the scope of the following claims.

The following examples may illustrate one or more aspects of the disclosure.

Example 1

A circuit comprising: a first regulation module configured to receive a supply voltage from a voltage source and generate, from the supply voltage, a first voltage at a first voltage rail that is less than the supply voltage; a second regulation module configured to receive the first voltage from the first voltage rail and to generate, from the first voltage, a second voltage at a second voltage rail that is less than the first voltage; a first monitoring module configured to generate a first warning signal when the first voltage at the first voltage rail exceeds a first threshold and to generate the first warning signal when a first testing voltage exceeds the first threshold; and a second monitoring module configured to generate a second warning signal when the second voltage at the second voltage rail exceeds a second threshold and to generate the second warning signal when a second testing voltage exceeds the second threshold, wherein the second threshold is less than the first threshold.

Example 2

The circuit of example 1, further comprising: a first decoupling module configured to prevent the first test voltage from providing power to the first voltage rail when the first testing voltage is greater than the first voltage; and a second decoupling module configured to prevent the second test voltage from providing power to the second voltage rail when the second testing voltage is greater than the second voltage.

Example 3

The circuit of any combination of examples 1-2, wherein the first decoupling module comprises a diode, the diode comprising an anode coupled to the first voltage rail and a cathode coupled to the first monitoring module.

Example 4

The circuit of any combination of examples 1-3, further comprising: a first testing module configured to generate, at an output of the first testing module, the first testing voltage to exceed the first threshold when operating in a first testing state, the output of the first testing module being coupled to the first monitoring module; and a second testing module configured to generate, at an output of the second testing module, a second testing voltage to exceed the second threshold when operating in a second testing state, the output of the second testing module being coupled to the second monitoring module.

Example 5

The circuit of any combination of examples 1-4, wherein the first testing module comprises a current source configured to generate current when operating in the first testing state and wherein the second testing module comprises a current source configured to generate current when operating in the second testing state.

Example 6

The circuit of any combination of examples 1-5, wherein: the first regulation module comprises a first switching element, the first switching element comprising a first node coupled to the voltage source, a second node coupled to the first voltage rail, and a control node; and the second regulation module comprises a second switching element, the second switching element comprising a first node coupled to the second node of the first switching element, a second node coupled to the second voltage rail, and a control node.

Example 7

The circuit of any combination of examples 1-6, further comprising: a first driving module configured to drive the first switching element to generate the first voltage at the second node of the first switching element; and a second driving configured to drive the second switching element to generate the second voltage at the second node of the second switching element.

Example 8

The circuit of any combination of examples 1-7, wherein: the first monitoring module comprises a first comparator, the first comparator comprising a first input coupled to the first node of the first switching element, a second node coupled, via the first decoupling module and a first threshold voltage source, to the second node of the first switching element and coupled to the output of the first testing module, and an output, wherein the first monitoring module generates the first warning signal at the output of the first comparator when a voltage at the second node of the first comparator exceeds a voltage at the first node of the first comparator; and the second monitoring module comprises a second comparator, the second comparator comprising a first input coupled to the first node of the second switching element, a second node coupled, via the second decoupling module and a second threshold voltage source, to the second node of the second switching element and coupled to the output of the second testing module, and an output, wherein the second monitoring module generates the second warning signal at the output of the second comparator when a voltage at the second node of the second comparator exceeds a voltage at the first node of the second comparator.

Example 9

The circuit of any combination of examples 1-8, further comprising a controller configured to: receive the first warning signal from the output of the first comparator; receive the second warning signal from the output of the second comparator; output, to the first testing module, a first command signal, to cause the first testing module to operate in the first testing mode; and output,to the second testing module, a second command signal, to cause the second testing module to operate in the second testing mode.

Example 10

The circuit of any combination of examples 1-9, wherein the controller is further configured to: output, to the first decoupling module, a third command signal, to cause the first decoupling module to decouple the first voltage rail from the first testing voltage when the first testing voltage is greater than the first voltage and to couple the first voltage rail to the first testing voltage when the first testing voltage is not greater than the first voltage; and output, to the second decoupling module, a fourth command signal, to cause the second decoupling module to decouple the second voltage rail from the second testing voltage when the second testing voltage is greater than the second voltage and to couple the second voltage rail to the second voltage rail when the second testing voltage is not greater than the second voltage.

Example 11

The circuit of any combination of examples 1-10, wherein: the first monitoring module comprises a Zener diode, the Zener diode comprising a cathode and an anode, wherein the cathode is coupled, via the first decoupling module, to the first voltage rail and coupled to the output of the first testing module and wherein the first monitoring module outputs the first warning signal at the anode of the Zener diode; and the second monitoring module comprises a switching element, the switching element comprising a first input coupled, via the second decoupling module, to the second voltage rail and coupled to the output of the second testing module, a second node, and a control node, the control node of the switching element being coupled to a voltage corresponding to the second voltage threshold, wherein the second monitoring module outputs the second warning signal at the second node of the switching element.

Example 12

The circuit of any combination of examples 1-11, further comprising a diagnostic module configured to: receive the first warning signal from the first monitoring module; receive the second warning signal from the second monitoring module; and output a combined warning signal in response to receiving the first warning signal or the second warning signal.

Example 13

The circuit of any combination of examples 1-12, further comprising an analog-to-digital converter, the analog-to-digital converter comprising the first monitoring module and the second monitoring module.

Example 14

A method comprising: receiving, by circuitry, a supply voltage from a voltage source; generating, by the circuitry, from the supply voltage, a first voltage at a first voltage rail that is less than the supply voltage; receiving, by the circuitry, the first voltage from the first voltage rail; generating, by the circuitry, from the first voltage, a second voltage at a second voltage rail that is less than the first voltage; generating, by the circuitry, a first warning signal when the first voltage at the first voltage rail exceeds a first threshold or when a first testing voltage exceeds the first threshold; and generating, by the circuitry, a second warning signal when the second voltage at the second voltage rail exceeds a second threshold or when a second testing voltage exceeds the second threshold, wherein the second threshold is less than the first threshold.

Example 15

The method of example 14, further comprising: decoupling, by the circuitry, the first voltage rail from the first testing voltage when the first testing voltage is greater than the first voltage; coupling, by the circuitry, the first voltage rail to the first testing voltage when the first testing voltage is not greater than the first voltage; decoupling, by the circuitry, the second voltage rail from the second testing voltage when the second testing voltage is greater than the second voltage; and coupling, by the circuitry, the second voltage rail to the second voltage rail when the second testing voltage is not greater than the second voltage.

Example 16

The method of any combination of examples 14-15, outputting, by the circuitry, a combined warning signal in response to the first warning signal or the second warning signal.

Example 17

The method of any combination of examples 14-16, further comprising: generating, by the circuitry, the first testing voltage to exceed the first threshold when operating in a first testing state; and generating, by the circuitry, a second testing voltage to exceed the second threshold when operating in a second testing state.

Example 18

The method of any combination of examples 14-17, further comprising: outputting, by the circuitry, a first command signal to operate in the first testing mode; and outputting, by the circuitry, a second command signal to operate in the second testing mode.

Example 19

The method of any combination of examples 14-18, further comprising: outputting, by the circuitry, a third command signal to decouple the first voltage rail from the first testing voltage when the first testing voltage is greater than the first voltage and to couple the first voltage rail to the first testing voltage when the first testing voltage is not greater than the first voltage; and outputting, by the circuitry, a fourth command signal to decouple the second voltage rail from the second testing voltage when the second testing voltage is greater than the second voltage and to couple the second voltage rail to the second voltage rail when the second testing voltage is not greater than the second voltage.

Example 20

A system comprising: a voltage source configured to output a supply voltage; a first regulation module configured to receive the supply voltage from the voltage source and generate, from the supply voltage, a first voltage at a first voltage rail that is less than the supply voltage; a second regulation module configured to receive the first voltage from the first voltage rail and to generate, from the first voltage, a second voltage at a second voltage rail that is less than the first voltage; a load coupled to the second voltage rail; a first monitoring module configured to generate a first warning signal when the first voltage at the first voltage rail exceeds a first threshold and to generate the first warning signal when a first testing voltage exceeds the first threshold; a second monitoring module configured to generate a second warning signal when the second voltage at the second voltage rail exceeds a second threshold and to generate the second warning signal when a second testing voltage exceeds the second threshold, wherein the second threshold is less than the first threshold; and a controller configured to receive an indication of the first warning signal and the second warning signal.

Example 21

An apparatus comprising: means for receiving a supply voltage from a voltage source; means for generating from the supply voltage, a first voltage at a first voltage rail that is less than the supply voltage; means for receiving the first voltage from the first voltage rail; means for generating, from the first voltage, a second voltage at a second voltage rail that is less than the first voltage; means for generating a first warning signal when the first voltage at the first voltage rail exceeds a first threshold or when a first testing voltage exceeds the first threshold; and means for generating a second warning signal when the second voltage at the second voltage rail exceeds a second threshold or when a second testing voltage exceeds the second threshold, wherein the second threshold is less than the first threshold.

Example 22

The apparatus of example 21, further comprising: means for decoupling the first voltage rail from the first testing voltage when the first testing voltage is greater than the first voltage; means for coupling the first voltage rail to the first testing voltage when the first testing voltage is not greater than the first voltage; means for decoupling the second voltage rail from the second testing voltage when the second testing voltage is greater than the second voltage; and means for coupling the second voltage rail to the second voltage rail when the second testing voltage is not greater than the second voltage.

Example 23

The apparatus of any combination of examples 21-22, further comprising: means for outputting a combined warning signal in response to the first warning signal or the second warning signal.

Example 24

The apparatus of any combination of examples 21-23, means for generating the first testing voltage to exceed the first threshold when operating in a first testing state; and means for generating a second testing voltage to exceed the second threshold when operating in a second testing state.

Example 25

The apparatus of any combination of examples 21-24, further comprising: means for outputting a first command signal to operate in the first testing mode; and means for outputting a second command signal to operate in the second testing mode.

Example 26

The apparatus of any combination of examples 21-25, further comprising: means for outputting a third command signal to decouple the first voltage rail from the first testing voltage when the first testing voltage is greater than the first voltage and to couple the first voltage rail to the first testing voltage when the first testing voltage is not greater than the first voltage; and means for outputting a fourth command signal to decouple the second voltage rail from the second testing voltage when the second testing voltage is greater than the second voltage and to couple the second voltage rail to the second voltage rail when the second testing voltage is not greater than the second voltage.

Various aspects have been described in this disclosure. These and other aspects are within the scope of the following claims.

The invention claimed is:

1. A circuit comprising:
a first regulation module implemented in circuitry and configured to receive a supply voltage from a voltage source and generate, from the supply voltage, a first voltage at a first voltage rail that is less than the supply voltage;
a second regulation module implemented in circuitry and configured to receive the first voltage from the first voltage rail and to generate, from the first voltage, a second voltage at a second voltage rail that is less than the first voltage;
a first monitoring module implemented in circuitry and configured to generate a first warning signal when the first voltage at the first voltage rail exceeds a first threshold and to generate the first warning signal when a first testing voltage exceeds the first threshold; and
a second monitoring module implemented in circuitry and configured to generate a second warning signal when the second voltage at the second voltage rail exceeds a second threshold and to generate the second warning signal when a second testing voltage exceeds the second threshold, wherein the second threshold is less than the first threshold.

2. The circuit of claim 1, further comprising:
a first decoupling module implemented in circuitry and configured to prevent the first test voltage from providing power to the first voltage rail when the first testing voltage is greater than the first voltage; and
a second decoupling module implemented in circuitry and configured to prevent the second test voltage from providing power to the second voltage rail when the second testing voltage is greater than the second voltage.

3. The circuit of claim 2, wherein the first decoupling module comprises a diode, the diode comprising an anode coupled to the first voltage rail and a cathode coupled to the first monitoring module.

4. The circuit of claim 2, further comprising:
a first testing module implemented in circuitry and configured to generate, at an output of the first testing module, the first testing voltage to exceed the first threshold when operating in a first testing state, the output of the first testing module being coupled to the first monitoring module; and
a second testing module implemented in circuitry and configured to generate, at an output of the second testing module, a second testing voltage to exceed the second threshold when operating in a second testing state, the output of the second testing module being coupled to the second monitoring module.

5. The circuit of claim 4, wherein the first testing module comprises a current source configured to generate current when operating in the first testing state and wherein the second testing module comprises a current source configured to generate current when operating in the second testing state.

6. The circuit of claim 4, wherein:
the first regulation module comprises a first switching element, the first switching element comprising a first node coupled to the voltage source, a second node coupled to the first voltage rail, and a control node; and
the second regulation module comprises a second switching element, the second switching element comprising a first node coupled to the second node of the first switching element, a second node coupled to the second voltage rail, and a control node.

7. The circuit of claim 6, further comprising:
a first driving module implemented in circuitry and configured to drive the first switching element to generate the first voltage at the second node of the first switching element; and
a second driving implemented in circuitry and configured to drive the second switching element to generate the second voltage at the second node of the second switching element.

8. The circuit of claim 6, wherein:
the first monitoring module comprises a first comparator, the first comparator comprising a first input coupled to the first node of the first switching element, a second node coupled, via the first decoupling module and a first threshold voltage source, to the second node of the first switching element and coupled to the output of the first testing module, and an output, wherein the first monitoring module generates the first warning signal at the output of the first comparator when a voltage at the second node of the first comparator exceeds a voltage at the first node of the first comparator; and
the second monitoring module comprises a second comparator, the second comparator comprising a first input coupled to the first node of the second switching element, a second node coupled, via the second decoupling module and a second threshold voltage source, to the second node of the second switching element and coupled to the output of the second testing module, and an output, wherein the second monitoring module generates the second warning signal at the output of the second comparator when a voltage at the second node of the second comparator exceeds a voltage at the first node of the second comparator.

9. The circuit of claim 8, further comprising a controller configured to:
receive the first warning signal from the output of the first comparator;
receive the second warning signal from the output of the second comparator;
output, to the first testing module, a first command signal, to cause the first testing module to operate in the first testing mode; and
output, to the second testing module, a second command signal, to cause the second testing module to operate in the second testing mode.

10. The circuit of claim 9, wherein the controller is further configured to:
output, to the first decoupling module, a third command signal, to cause the first decoupling module to decouple the first voltage rail from the first testing voltage when the first testing voltage is greater than the first voltage and to couple the first voltage rail to the first testing voltage when the first testing voltage is not greater than the first voltage; and output, to the second decoupling module, a fourth command signal, to cause the second decoupling module to decouple the second voltage rail from the second testing voltage when the second testing voltage is greater than the second voltage and to couple the second voltage rail to the second voltage rail when the second testing voltage is not greater than the second voltage.

11. The circuit of claim 6, wherein:
the first monitoring module comprises a Zener diode, the Zener diode comprising a cathode and an anode, wherein the cathode is coupled, via the first decoupling module, to the first voltage rail and coupled to the output of the first testing module and wherein the first monitoring module outputs the first warning signal at the anode of the Zener diode; and
the second monitoring module comprises a switching element, the switching element comprising a first input coupled, via the second decoupling module, to the second voltage rail and coupled to the output of the second testing module, a second node, and a control node, the control node of the switching element being coupled to a voltage corresponding to the second voltage threshold, wherein the second monitoring module outputs the second warning signal at the second node of the switching element.

12. The circuit of claim 11, further comprising a diagnostic module configured to:
receive the first warning signal from the first monitoring module;
receive the second warning signal from the second monitoring module; and
output a combined warning signal in response to receiving the first warning signal or the second warning signal.

13. The circuit of claim 1, further comprising an analog-to-digital converter, the analog-to-digital converter comprising the first monitoring module and the second monitoring module.

14. A method comprising:
receiving, by circuitry, a supply voltage from a voltage source;
generating, by the circuitry, from the supply voltage, a first voltage at a first voltage rail that is less than the supply voltage;
receiving, by the circuitry, the first voltage from the first voltage rail;
generating, by the circuitry, from the first voltage, a second voltage at a second voltage rail that is less than the first voltage;
generating, by the circuitry, a first warning signal when the first voltage at the first voltage rail exceeds a first threshold or when a first testing voltage exceeds the first threshold; and
generating, by the circuitry, a second warning signal when the second voltage at the second voltage rail exceeds a second threshold or when a second testing voltage exceeds the second threshold, wherein the second threshold is less than the first threshold.

15. The method of claim 14, further comprising:
decoupling, by the circuitry, the first voltage rail from the first testing voltage when the first testing voltage is greater than the first voltage;
coupling, by the circuitry, the first voltage rail to the first testing voltage when the first testing voltage is not greater than the first voltage;

decoupling, by a circuitry, the second voltage rail from the second testing voltage when the second testing voltage is greater than the second voltage; and coupling, by the circuitry, the second voltage rail to the second voltage rail when the second testing voltage is not greater than the second voltage.

16. The method of claim 15, further comprising:

outputting, by the circuitry, a combined warning signal in response to the first warning signal or the second warning signal.

17. The method of claim 14, further comprising:

generating, by the circuitry, the first testing voltage to exceed the first threshold when operating in a first testing state; and generating, by the circuitry, a second testing voltage to exceed the second threshold when operating in a second testing state.

18. The method of claim 17, further comprising:

outputting, by the circuitry, a first command signal to operate in the first testing mode; and outputting, by the circuitry, a second command signal to operate in the second testing mode.

19. The method of claim 18, further comprising:

outputting, by the circuitry, a third command signal to decouple the first voltage rail from the first testing voltage when the first testing voltage is greater than the first voltage and to couple the first voltage rail to the first testing voltage when the first testing voltage is not greater than the first voltage; and outputting, by the circuitry, a fourth command signal to decouple the second voltage rail from the second testing voltage when the second testing voltage is greater than the second voltage and to couple the second voltage rail to the second voltage rail when the second testing voltage is not greater than the second voltage.

20. A system comprising:

a voltage source configured to output a supply voltage;

a first regulation module implemented in circuitry and configured to receive the supply voltage from the voltage source and generate, from the supply voltage, a first voltage at a first voltage rail that is less than the supply voltage;

a second regulation module implemented in circuitry and configured to receive the first voltage from the first voltage rail and to generate, from the first voltage, a second voltage at a second voltage rail that is less than the first voltage;

a load coupled to the second voltage rail;

a first monitoring module implemented in circuitry and configured to generate a first warning signal when the first voltage at the first voltage rail exceeds a first threshold and to generate the first warning signal when a first testing voltage exceeds the first threshold;

a second monitoring module implemented in circuitry and configured to generate a second warning signal when the second voltage at the second voltage rail exceeds a second threshold and to generate the second warning signal when a second testing voltage exceeds the second threshold, wherein the second threshold is less than the first threshold; and a controller configured to receive an indication of the first warning signal and the second warning signal.

* * * * *